United States Patent [19]

Heck

[11] Patent Number: 4,864,252
[45] Date of Patent: Sep. 5, 1989

[54] SAMPLE-AND-HOLD PHASE DETECTOR FOR USE IN A PHASE LOCKED LOOP

[75] Inventor: Joseph P. Heck, Ft. Worth, Tex.

[73] Assignee: Motorola, Inc., Schaumburg, Ill.

[21] Appl. No.: 249,475

[22] Filed: Sep. 26, 1988

[51] Int. Cl.$^4$ .................................... H03L 7/08
[52] U.S. Cl. .................................... 331/1 A; 331/14; 331/17; 331/25; 307/527; 328/134; 455/263
[58] Field of Search .............. 331/1 A, 14, 17, 18, 331/25; 307/516, 526, 527, 528; 328/133, 134, 155; 455/260, 263, 265; 375/118, 119, 120

[56] References Cited

U.S. PATENT DOCUMENTS 3,986,125 10/1976 Eibner .................................... 328/62
4,184,122 1/1980 Clark et al. ........................... 331/1 A Primary Examiner—David Mis
Attorney, Agent, or Firm—Thomas G. Berry; Juliana Agon

[57] ABSTRACT

A sample-and-hold type phase detector provides a linear positive or negative going ramp signal that may be used to linearly control a phase-locked loop over approximately a ±360° phase range.

17 Claims, 3 Drawing Sheets

SAMPLE-AND-HOLD PHASE DETECTOR FOR USE IN A PHASE LOCKED LOOP

TECHNICAL FIELD

This invention relates generally to phase-locked loops, and more specifically to sample-and-hold type phase-locked loops, and is more particularly directed toward a phase detector for providing linear operation over approximately a ±360° phase range.

BACKGROUND ART

Often, it is necessary to operate a phase-locked loop with a relatively low loop-gain. A typical situation may be, for example, to maintain loop stability in the presence of multi-pole loop filters. When loop-gain is low, it is possible for the phase difference between a reference signal and an input signal to exceed the maximum phase difference allowed for the linear operation of a phase detector. Since the phase difference that may appear at a phase detector is inversely proportional to the loop-gain, the probability that, as the loop-gain is lowered, the phase difference between the reference signal and the input signal will exceed the maximum phase difference permitted by the phase detector is quite high.

One solution may be to use charge-pump type phase detectors in all situations where low loop-gain is required. However, charge-pump type phase detectors are often less desirable than sample-and-hold type phase detectors because charge-pump type phase detectors may exhibit undesirable responses in certain implementations due to an extra integrator inherent in the loop. Additionally, sample-and-hold type phase detectors offer a wider operational bandwidth since charge-pump type phase detectors exhibit increased reference frequency spurs. Accordingly, a need exists in the art for a sample-and-hold type phase detector having a wide phase range to facilitate linear operation of low loop-gain phase-locked loops.

SUMMARY OF THE INVENTION

Accordingly, it is an object of the present invention to provide a phase-locked loop having linear operation over approximately a ±360° phase differential.

It is a further object of the present invention to provide a sample-and-hold phase detector having linear operation over approximately a ±360° phase differential for use in phase-locked loops.

Briefly, according to the invention, a sample-and-hold type phase detector provides a linear positive or negative going ramp signal that may be used to linearly control a phase-locked loop over approximately a ±360° (i.e., 4π radians) phase range.

DETAILED DESCRIPTION OF THE PREFERRED EMBODIMENT

Figure 1:
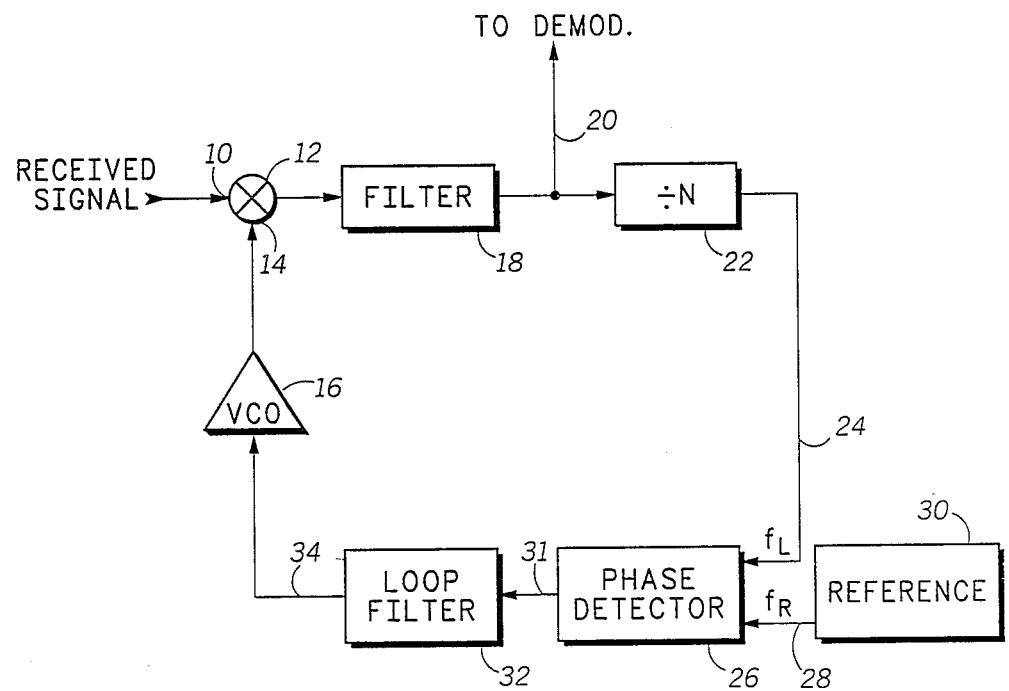
FIG. 1 is a block diagram of phase-locked loop, which incorporates the invention, employed in a radio receiver.

Referring now to FIG. 1, there is shown a block diagram of the present invention in a radio frequency receiver. After any appropriate band-limiting and frequency conversion, a received signal is received (10) by a mixer (convertor) 12, which accepts as a second input (14) a signal from a voltage-controlled oscillator (VCO) (16). The output of the mixer (12) is coupled to a filter (18), which may be an intermediate frequency (IF) filter of the radio receiver. The filtered signal is coupled (20) to any suitable demodulation network (not shown) and to a divider (22), which divides the frequency of the filtered signal as is known in the art. The divided signal (24) is referred to herein as the input signal (denoted $f_L$) and is coupled to a phase detector (26), which accepts as a second input a reference signal (28) (denoted $f_R$) provided by any suitable reference signal source (30). Generally, $f_L$ will be approximately equal to $f_R$ when the loop is locked.

The phase detector (26) provides an output signal (31) corresponding to the difference in the phase relationship between the input signal (24) and the reference signal (28). This signal (31) is filtered by a suitable loop filter (32), which may comprise a multi-pole filter to provide a suitable control signal (34). The control signal (34) controls the VCO (16), which is coupled to the mixer (12).

The presence of the IF filter (18) may cause significant phase shift in the loop at frequencies approaching the filter cut-off frequency. Therefore, it is customary to reduce the loop-gain in order to maintain loop stability. This tends to make the maximum phase difference at the phase detector (26) larger due to the inverse relationship between loop-gain and the maximum phase difference. As the loop-gain is reduced, the phase difference between $f_L$ and $f_R$ may exceed the maximum phase difference that a conventional phase detector may accept to remain in linear operation. Conversely, the divider (22) reduces the phase deviation into the phase detector (26), but additionally requires that the loop bandwidth be reduced thereby increasing loop lock-time. Accordingly, it is desirable to minimize the divide ratio (N) of the divider (22). Thus, some other means must be found to reduce the phase difference between $f_L$ and $f_R$, or the phase detector (26) must be designed to provide linear operation over extremely broad input phase ranges.

Figure 2:
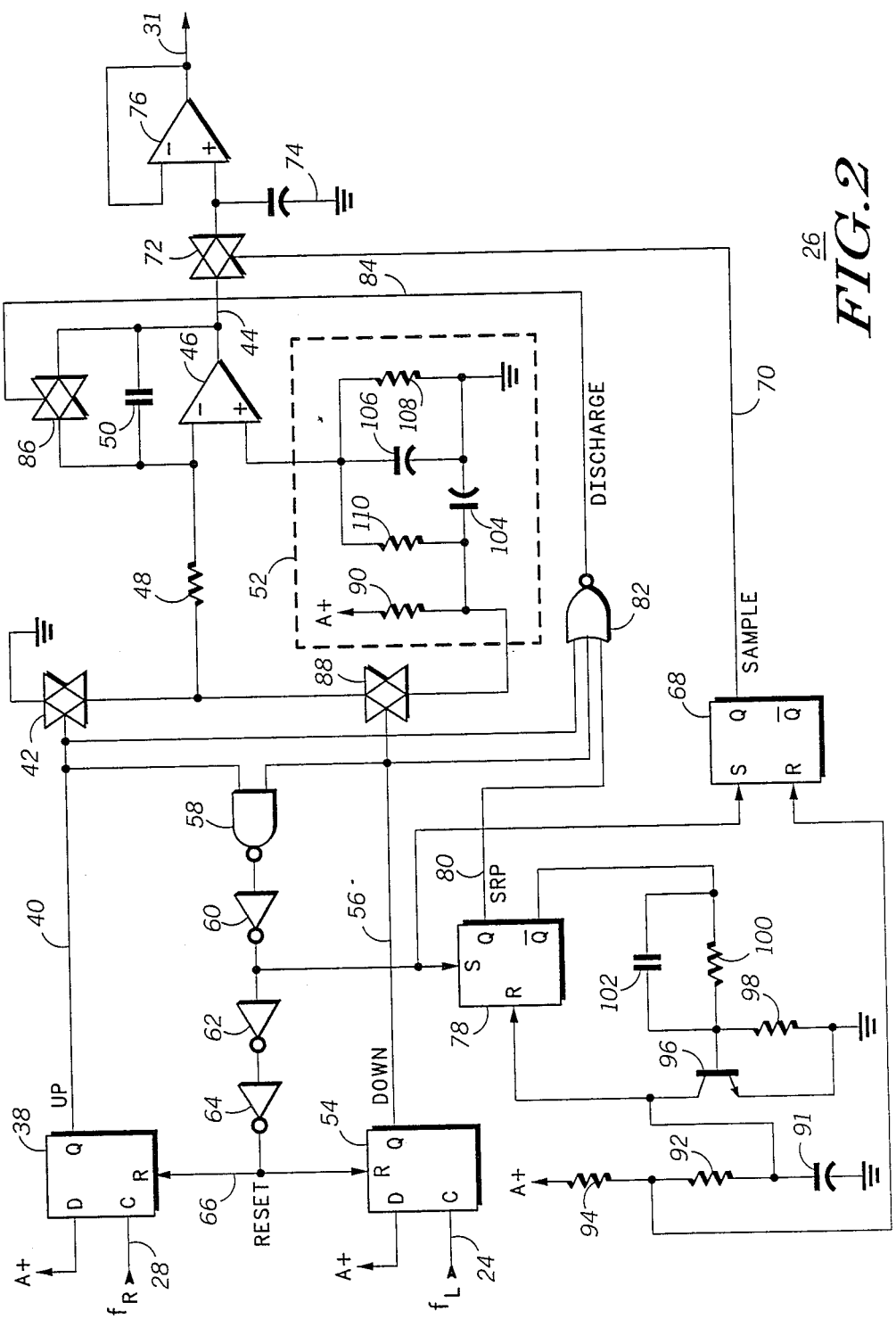
FIG. 2 is a schematic diagram of the phase detector of FIG. 1.
Figure 3:
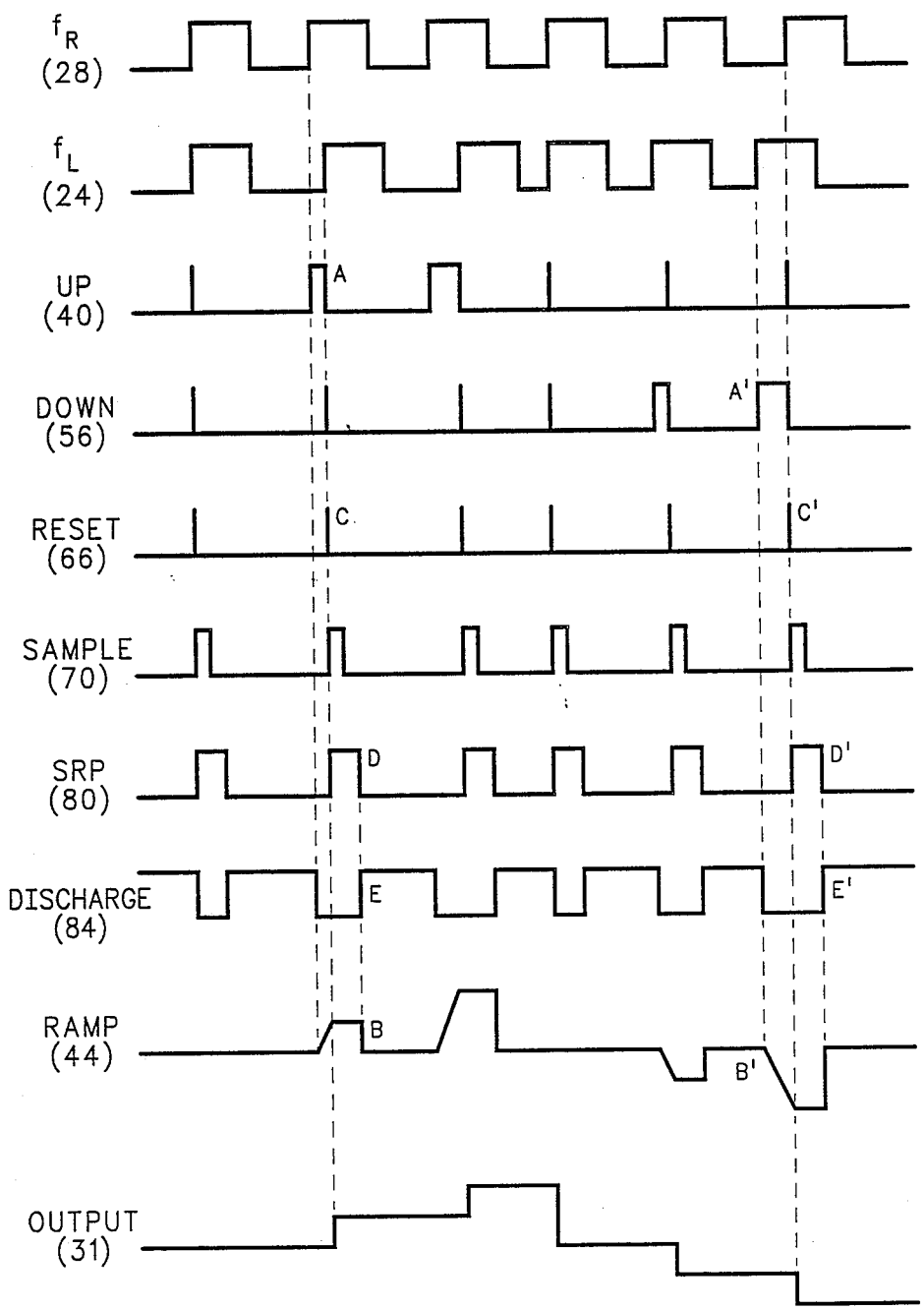
FIG. 3 is a timing diagram illustrating the timing of some of the signals denoted in FIG. 2.

Referring now to FIGS. 2 and 3, the operation of the phase detector (26) of the present invention may be described. When $f_L$ (24) lags $f_R$ (28), a D-type flip-flop (38) will assert a signal (40) (denoted UP) on the leading edge of $f_R$ (reference letter A of FIG. 3). The asserted UP signal (40) activates a transmission gate (42), which couples a biasing resistor (48) to ground, thereby causing the generation of a positive-going ramp signal (44) at the output of an operational amplifier (46) (reference letter B of FIG. 3). The operational amplifier (46) is arranged as a ramp generator having suitable bias (48 and 52) and a capacitive feedback path (50). The gain of the phase detector is established by the resistor (48) and the capacitor (50). When the leading edge of the laging $f_L$ (24) arrives, a second D-type flip-flop (54) asserts a signal (56) (denoted DOWN). A NAND gate (58) receives both the UP signal (40) and the DOWN signal (56) and provides (by way of an inverter string (60-64) to allow for an appropriate time delay) a RESET signal (66), which resets both the D-type flip-flops (38 and 54) to negate the UP and DOWN signals respectively (reference letter C of FIG. 3).

The output of the first inverter (60) is also coupled to a Set-Reset type flip-flop (68), which causes the assertion of a SAMPLE signal (70). When asserted, the SAMPLE signal (70) activates a transmission gate (72), which passes the existing potential of the ramp signal (44) to storage capacitor (74). Preferably, the capacitor (74) has a value of 100pf, although other values may be used. The buffered (76) potential on the storage capacitor (74) comprises the output signal (31). Additionally, the output of the first inverter (60) is coupled to a second Set-Reset type flip-flop (78), which asserts a signal (80) (denoted SRP) having its leading edge coincident with the leading edge of the SAMPLE signal (70), but having a somewhat longer duration (reference letter D of FIG. 3). Those skilled in the art will appreciate that the duration of the SRP signal limits how closely the linear phase range of the present invention may approach exactly ±360°. Generally, the actual phase range for linear operation of the phase detector of the present invention may be determined by equation 1 below:

$$\pm 360° (1 - t_{SRP})/t_{Ref} \quad (1)$$

Where:

$t_{SRP}$ = duration of the SRP signal; and,
$t_{Ref}$ = duration of the reference signal.

The duration of both the SAMPLE signal (70) and the SRP signal (80) are determined by the charging time of a capacitor (91), which is coupled to A+ via resistors (92 and 94). A transistor (96) and its associated biasing components (98-102) provide a rapid discharge path to ground for the capacitor (90). Although optimum component vales will vary depending upon each implementation choice of the reference frequency, the preferred values for $f_R$ equal to 100 kHz are listed in Table 1.

TABLE 1

| | |
|---|---|
| Resistor 92 | 3.9 k ohms |
| Resistor 94 | 6.8 k ohms |
| Resistor 98 | 10 k ohms |
| Resistor 100 | 10 k ohms |
| Capacitor 90 | 270 pf |
| Capacitor 102 | 62 pf |

The SRP signal (80) is NORed (82) with the UP (40) and DOWN (56) signals to form a signal (84) (denoted DISCHARGE) on the trailing edge of the SRP signal (80) (reference letter E of FIG. 3). When asserted, the DISCHARGE signal (84) activates a transmission gate (86), which is parallel coupled across the capacitive feedback path (50) of the ramp generator (op amp) (46). The activated transmission gate (86) shorts out the capacitor (50) thereby discharging any potential that may be across it and causes the output of the op amp (46) to return to the fixed voltage provided as its positive input. The time interval between the trailing edge of the SAMPLE signal (70) and the trailing edge of the SRP signal (80) insures that the transmission gate (72) is fully deactivated before the ramp capacitor (50) is discharged by the transmission gate (86). In this way, the ramp generator is prepared for the next sampling interval (window).

Referring still to FIGS. 2 and 3, when $f_R$ (28) lags $f_L$ (24), the D-type flip-flop (54) will assert the DOWN signal (56) on the leading edge of $f_L$ (reference letter A' of FIG. 3). The asserted DOWN signal (56) activates a transmission gate (88), which couples a biasing resistor (48) to A+ via a resistor (90), thereby causing the generation of a negative-going ramp signal (44) at the output of the operational amplifier (46) (reference letter B' of FIG. 3). The resistor (90) and the capacitor (104) of the biasing network (52) comprises a ripple filter to filter any noise or ripple that may be present on the A+ supply. Preferably, the value of the resistors (110 and 108) are approximately equal to insure similar phase detector response to both positive and negative going phase differences. Additionally, a capacitor (106) filters the reference voltage established at the junction of the resistors (110 and 108). This reference voltage is provided to the op amp (46) at its positive input port. Although many implementations are possible, the preferred values of the biasing components to establish a phase gain of 1.7 volts/radian with A+ equal to 9.6 volts and $f_R$ equal to 100 L kHz are tabulated in Table 2.

TABLE 2

| | |
|---|---|
| Resistor 48 | 3.3 k ohms |
| Resistor 90 | 2.7 k ohms |
| Resistor 108 | 10 k ohms |
| Resistor 110 | 10 k ohms |
| Capacitor 50 | .001 μf |
| Capacitor 104 | 10 μf |
| Capacitor 106 | 1 μf |

When the leading edge of the laging $f_R$ (28) arrives, the D-type flip-flop (38) asserts the UP signal (40). The NAND gate (58) receives both the UP signal (40) and the DOWN signal (56) and provides (by way of an inverter string (60-64) to allow for an appropriate time delay) the RESET signal (66), which resets both the D-type flip-flops (38 and 54). Upon reset, both the D-type flip-flops (38 and 54) negate the UP and DOWN signals respectively (reference letter C' of FIG. 3).

As discussed above, the output of the first inverter (60) is also coupled to the Set-Reset type flip-flop (68), which causes the assertion of the SAMPLE signal (70). The asserted, SAMPLE signal (70) activates the transmission gate (72), which passes the existing potential of the ramp signal (44) to the storage capacitor (74). The buffered (76) potential on the storage capacitor (74) comprises the output signal (31). Additionally, the output of the first inverter (60) is coupled to the Set-Reset type flip-flop (78), which asserts the SRP signal (80) (reference letter D' of FIG. 3). The SRP signal (80), the UP signal (40), and the DOWN (56) signal form the DISCHARGE signal (84), which, when asserted, activates the transmission gate (86) discharging the capacitive feedback path (50) of the ramp generator (op amp) (46) so that the ramp generator is prepared for the next sampling interval (window) (reference letter E' of FIG. 3).

Referring now to FIG. 3, the timing relationships of the present invention to achieve an approximate ±360° phase range are illustrated. When $f_L$ (24) lags $f_R$ (28), the UP signal (40) is asserted on the leading edge of $f_R$. The asserted UP signal (40) triggers the generation of the positive-going ramp signal (44). According to the invention, $f_R$ has a predetermined period. The laging $f_L$ may arrive at any time during this period, which defines approximately one-half of the sampling interval (window) of the present invention (i.e., 360° or 2π radians). When the leading edge of the laging $f_L$ (24) arrives, the DOWN signal (56) is generated. A combination (NAND) of both the UP signal (40) and the DOWN signal (56) generates the RESET signal (66), which negates the UP and DOWN signals respectively, and causes the assertion of a SAMPLE signal (70). Additionally, the SRP signal (80), having its leading edge coincident with the leading edge of the SAMPLE signal (70), but having a somewhat longer duration is generated.

The SRP signal (80) is combined (NORed) with the UP (40) and DOWN (56) signals to form the DISCHARGE signal on the trailing edge of the SRP signal (80). When asserted, the DISCHARGE signal (84) causes the ramp signal (44) to discharge to prepare for the next sampling interval (window). The time interval between the trailing edge of the SAMPLE signal (70) and the trailing edge of the SRP signal (80) may be adjusted to insure that the sample has been completed before the discharge takes place.

Referring still to FIG. 3, when $f_R$ (28) lags $f_L$ (24), the DOWN signal (56) is asserted on the leading edge of $f_L$. The asserted DOWN signal (56) causes the generation of a negative-going ramp signal (44). As discussed above, the laging signal may arrive at any time during the period of $f_L$, which determines the other approximate one-half of the sampling interval (window). Thus, the present invention provides a linear operation over approximately two 360° periods or approximately ±360° (i.e., $4\pi$ radians linear operating range) from a given reference. When the leading edge of the laging $f_R$ (28) arrives, the UP signal (40) is asserted. Both the UP signal (40) and the DOWN signal (56) are combined (NANDed) to provide RESET signal (66), which negates the UP and DOWN signals respectively, in addition to causing the assertion of the SAMPLE signal (70). The asserted, SAMPLE signal (70) causes the existing level of teh ramp signal (44) to be transferred to the output signal (31). Further, the SRP signal (80) is generated, which, together with the UP signal (40), and the DOWN (56) signal form the DISCHARGE signal (84), which discharges the ramp signal to prepare for the next sampling interval (window).

What is claimed is:

1. A sample-and-hold phase detector, comprising:
   means for receiving a reference signal having a predetermined period:
   means for receiving an input signal at any time within a sampling window consisting of approximately two consecutive periods of said reference signal;
   means for sampling a ramp waveform to provide a linear output signal proportional to the difference between said input signal and an approximate center of said sampling window.

2. The sample-and-hold phase detector, of claim 1, wherein said sampling window comprises a moving window having a duration of approximately two consecutive periods of said reference signal, said sampling window occurring for every consecutive period of said reference signal.

3. The sample-and-hold phase detector, of claim 1, which includes means for filtering said linear output signal to provide a control signal.

4. A sample-and-hold phase detector comprising:
   means for receiving a reference signal having a predetermined period;
   means for providing a sampling window comprising approximately two consecutive periods of said reference signal, said sampling window having at least an approximate center;
   means for receiving an input signal at any time during said sampling window;
   means for sampling a ramp waveform to provide a linear output signal proportional to the difference between said input signal and said approximate center of said sampling window.

5. A method for controlling a sample-and-hold type voltage controlled oscillator in response to an input signal and a reference signal having a predetermined period, comprising the steps of:
   (a) comparing said input signal and said reference signal:
   (b) sampling a ramp waveform to generate a control signal proportional to a phase difference between said input signal and said reference signal, said control signal being linear over substantially two consecutive periods of said reference signal.

6. The method of claim 5, which includes the step of: providing said control signal to a voltage controlled oscillator.

7. The method of claim 6, which includes the step of filtering said control signal prior to providing said control signal to said voltage controlled oscillator.

8. A sample-and-hold phase detector, comprising:
   means for receiving an input signal;
   means for receiving a reference signal having a predetermined period;
   means for comparing said input signal, and said reference signal, and for sampling a ramp waveform to generate a control signal proportional to a phase difference between said input signal and said reference signal, said control signal being linear over substantially two consecutive periods of said reference signal.

9. The sample-and-hold phase detector of claim 8, which includes means for coupling said control signal to a voltage controlled oscillator.

10. The sample-and-hold phase detector of claim 9, which includes filter means for filtering said control signal prior to providing said control signal to said volage controlled oscillator.

11. The sample-and-hold phase detector of claim 10, wherein said filter means comprises a low pass filter.

12. A sample-and-hold phase detector, comprising:
   means for receiving a reference signal having a predetermined period;
   means for receiving an input signal at any time during two consecutive periods of said reference signal;
   means for initiating a positive going linear ramp waveform whenever said reference signal leads said input signal by less than 360 degrees;
   means for initiating a negative going linear ramp waveform whenever said input signal leads said reference signal by less than 360 degrees;
   means for sampling said positive or negative going ramp waveforms at the beginning of the next period of said input signal to provide a sampled ramp signal;
   means for providing an output signal proportional to said sampled ramp signal.

13. The sample-and-hold phase detector of claim 12, which includes means for filtering said output signal.

14. The sample-and-hold phase detector of claim 13, wherein said filtering means comprises a low pass filter.

15. A phase locked loop capable of linear operation over a $4\pi$ radians phase range of a reference signal, comprising:
   voltage controlled oscillator means for providing an output signal in response to a control signal;
   said reference signal having a predetermined period; and,
   phase detector means, comprising:

(i) means for receiving said reference signal;
(ii) means for receiving an input signal at any time within a sampling window comprising approximately two consecutive periods of said reference signal; and
(iii) means for sampling a ramp waveform to provide said control signal, such that said control signal is linear over said sampling window, and proportional to the difference between said input signal and an approximate center of said sampling window.

16. The phase locked loop of claim 15, which includes means for dividing said input signal to provide a divided input signal to said phase detector.

17. The phase locked loop of claim 15, which includes means for filtering said control signal to provide a filtered control signal to said voltage controlled oscillator means.

* * * * *